(12) United States Patent
Subramaniam

(10) Patent No.: US 11,079,151 B2
(45) Date of Patent: Aug. 3, 2021

(54) CONTROLLING SYSTEMS WITH MOTOR DRIVES USING PULSE WIDTH MODULATION

(71) Applicant: LENNOX INDUSTRIES INC., Richardson, TX (US)

(72) Inventor: Palanivel Subramaniam, Richardson, TX (US)

(73) Assignee: Lennox Industries Inc., Richardson, TX (US)

(*) Notice: Subject to any disclaimer, the term of this patent is extended or adjusted under 35 U.S.C. 154(b) by 0 days.

(21) Appl. No.: 16/901,766

(22) Filed: Jun. 15, 2020

(65) Prior Publication Data
US 2020/0340724 A1    Oct. 29, 2020

Related U.S. Application Data

(62) Division of application No. 15/619,659, filed on Jun. 12, 2017, now Pat. No. 10,731,907.

(51) Int. Cl.
*F25B 49/00* (2006.01)
*F25B 49/02* (2006.01)
(Continued)

(52) U.S. Cl.
CPC ......... *F25B 49/025* (2013.01); *H02M 5/4585* (2013.01); *H02P 27/085* (2013.01);
(Continued)

(58) Field of Classification Search
CPC ............ F25B 2500/13; F25B 2600/024; F25B 2600/11; F25B 49/025; H02M 5/4585; H02P 27/085; H03K 7/08
See application file for complete search history.

(56) References Cited

U.S. PATENT DOCUMENTS 8,704,482 B2 * 4/2014 Maruyama .......... H02M 5/4585
                                                        318/801
9,816,743 B2    11/2017 Nakase et al.
(Continued)

FOREIGN PATENT DOCUMENTS

EP    2546979 A1    1/2013
EP    3007345 A1    4/2016

OTHER PUBLICATIONS

Extended European Search Report of European Patent Office, Application No. 18172331.3, dated Oct. 29, 2018, 7 pages.

*Primary Examiner* — Filip Zec
(74) *Attorney, Agent, or Firm* — Baker Botts L.L.P.

(57) ABSTRACT

A system includes an electronic power converter and a controller. The electronic power converter supplies power to one or more motor drives of an HVAC and/or refrigeration system. The controller obtains a plurality of pulse width modulation (PWM) algorithms. Each PWM algorithm has an associated harmonic signature. The controller further determines one or more resonance frequencies associated with the HVAC and/or refrigeration system. The controller also selects a first PWM algorithm from the plurality of PWM algorithms based at least in part on the harmonic signature associated with the first PWM algorithm mitigating the one or more resonance frequencies associated with the refrigeration system. The controller further operates the electronic power converter according to the first PWM algorithm.

20 Claims, 3 Drawing Sheets

(51) Int. Cl.
*H02P 27/08* (2006.01)
*H02M 5/458* (2006.01)
*H03K 7/08* (2006.01)

(52) U.S. Cl.
CPC ..... *F25B 2500/13* (2013.01); *F25B 2600/024* (2013.01); *F25B 2600/11* (2013.01); *H03K 7/08* (2013.01)

(56) References Cited

U.S. PATENT DOCUMENTS

| | | | |
|---|---|---|---|
| 9,998,058 B2* | 6/2018 | Takahashi | H02P 21/22 |
| 10,014,776 B2 | 7/2018 | Kobayashi et al. | |
| 10,281,185 B2* | 5/2019 | Uemura | F25B 49/025 |
| 2008/0174255 A1* | 7/2008 | Schnetzka | H02P 29/50 |
| | | | 318/12 |
| 2013/0036759 A1 | 2/2013 | Harada et al. | |
| 2014/0036552 A1 | 2/2014 | Saji | |
| 2014/0266488 A1 | 9/2014 | Bors | |
| 2014/0375240 A1 | 12/2014 | Kawashima et al. | |
| 2015/0108929 A1 | 4/2015 | Nobe et al. | |
| 2016/0294317 A1 | 10/2016 | Nakai | |

* cited by examiner

CONTROLLING SYSTEMS WITH MOTOR DRIVES USING PULSE WIDTH MODULATION

CROSS-REFERENCE TO RELATED APPLICATIONS

This application is a divisional of U.S. patent application Ser. No. 15/619,659 filed Jun. 12, 2017, by Palanivel Subramaniam., and entitled "Controlling Systems with Motor Drives Using Pulse Width Modulation," which is incorporated herein by reference.

TECHNICAL FIELD

Certain embodiments of this disclosure relate generally to a system with one or more motor drives and, more specifically, to controlling a system with one or more motor drives using pulse width modulation (PWM).

BACKGROUND

HVAC and or refrigeration systems may supply power to one or more motor drives of a system using a power supply. Analog power supplies, such as linear power supplies, cause waste heat during operation by carrying current regardless of the required power of the system. Digital power supplies provide efficient power supply by using pulse-width modulation (PWM) to quickly switch on and off power, in order to provide the desired power at the one or more motor drives of the system. Unfortunately, existing PWM methods may cause significant mechanical vibrations in components driven by the one or more motor drives of the system, which may be detrimental to the system.

SUMMARY OF THE DISCLOSURE

According to one embodiment, a system includes an electronic power converter and a controller. The electronic power converter supplies power to one or more components of a HVAC and/or refrigeration system. The controller obtains a plurality of pulse width modulation (PWM) algorithms. Each PWM algorithm has an associated harmonic signature. The controller further determines one or more resonance frequencies associated with the HVAC and/or refrigeration system. The controller also selects a first PWM algorithm from the plurality of PWM algorithms based at least in part on the harmonic signature associated with the first PWM algorithm mitigating the one or more resonance frequencies associated with the HVAC and/or refrigeration system. The controller further operates the electronic power converter according to the first PWM algorithm.

According to another embodiment, a method includes obtaining a plurality of pulse width modulation (PWM) algorithms. Each PWM algorithm has an associated harmonic signature. The method further includes determining one or more resonance frequencies associated with a HVAC and/or refrigeration system. The method further includes selecting a first PWM algorithm from the plurality of PWM algorithms based at least in part on the harmonic signature associated with the first PWM algorithm mitigating the one or more resonance frequencies associated with the HVAC and/or refrigeration system. The method further includes operating an electronic power converter operable to supply power to one or more components of the HVAC and/or refrigeration system according to the first PWM algorithm.

According to yet another embodiment, a non-transitory computer readable medium includes instructions. The instructions, when executed by a computer, cause the computer to obtain a plurality of pulse width modulation (PWM) algorithms. Each PWM algorithm has an associated harmonic signature. The instructions further cause the computer to determine one or more resonance frequencies associated with a HVAC and/or refrigeration system. The instructions further cause the computer to select a first PWM algorithm from the plurality of PWM algorithms based at least in part on the harmonic signature associated with the first PWM algorithm mitigating the one or more resonance frequencies associated with the HVAC and/or refrigeration system. The instructions further cause the computer to operate an electronic power converter operable to supply power to one or more components of the HVAC and/or refrigeration system according to the first PWM algorithm.

Certain embodiments may provide one or more technical advantages. For example, certain embodiments allow the adjustment of the PWM algorithm used to supply power to the HVAC and/or refrigeration system to reduce mechanical vibrations. For example, the PWM algorithm may be adjusted or replaced with another PWM algorithm that mitigates the determined resonance frequencies associated with the HVAC and/or refrigeration system. In this manner, a PWM algorithm may be selected that avoids having component frequencies that are harmonics of the one or more resonance frequencies associated with the HVAC and/or refrigeration system. As another example, certain embodiments allow for the determination and comparison of levels of vibration to select a replacement PWM algorithm. For example, the amount of vibration that would result from using different PWM algorithms may be determined and then compared to choose the optimal PWM algorithm. As yet another advantage, in certain embodiments, an optimal PWM algorithm may be selected out of a plurality of PWM algorithms by comparing the one or more resonance frequencies associated with the HVAC and/or refrigeration system to the harmonic signatures of each of the PWM algorithms. In this manner, an optimal PWM algorithm may be selected during operation of the HVAC and/or refrigeration system. Depending on the embodiment, the optimal PWM algorithm may produce the least amount of mechanical vibration or may produce a sufficiently low amount of mechanical vibration (e.g., based on a threshold, based on being a member of a subset of N algorithms with the lowest mechanical vibrations, etc.). Certain embodiments may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present disclosure, reference is now made to the following description, taken in conjunction with the accompanying drawings, in which.

DETAILED DESCRIPTION

Embodiments of the present disclosure and its advantages are best understood by referring to FIGS. 1 through 4 of the drawings, like numerals being used for like and corresponding parts of the various drawings.

HVAC and/or refrigeration systems and other systems using one or more motor drives typically use digital power supplies as a more efficient solution for providing power to various components of the system. For example, a digital power supply may supply current to one or more motor drive driving compressors, fans, coolers or other components in a HVAC and/or refrigeration system. Digital power supplies use pulse width modulation (PWM), which modulates the voltage provided to various components a series of on and off pulses. These pulses, when viewed in aggregate, may deliver the desired input voltage and power at the powered components of the HVAC and/or refrigeration system. For example, certain pulse width modulation techniques may provide varying voltage and power, such as sinusoidal current wave forms, or may provide constant supplies of power for certain periods of time.

The switching caused by a PWM algorithm may inject particular frequencies to the power supplied to one or more components of the HVAC and/or refrigeration system. For example, in response to the power supplied by the PWM algorithm, a motor drive driving a compressor may respond with torque which resonates with the one or more frequencies injected by the PWM algorithm. If these frequencies overlap with the resonance frequencies of the mechanical assemblies of the components of the HVAC and/or refrigeration system, the mechanical assemblies may vibrate, causing noise and damage to the mechanical assemblies and/or the HVAC and/or refrigeration system. Existing PWM methods do not account for the potential mechanical vibrations caused by resonance with component frequencies in the PWM algorithms and fail to provide any type of adjustment to avoid or reduce these vibrations. Instead, existing solutions may include providing dampening material to the mechanical assemblies, which, in turn, increases material costs and may reduce efficiency. Other existing solutions may include manually changing the PWM algorithm when an operator notices excessive noise or vibration. Not only does this require manual input, but also independent detection, which may happen only by accident or after damage has occurred.

In certain embodiments, systems and methods may provide the ability to operate a power convertor supplying power to a HVAC and/or refrigeration system according to a PWM algorithm that mitigates the one or more resonance frequencies associated with the HVAC and/or refrigeration system. For example, the power converter may use a PWM algorithm that minimizes the overlap between the injected frequencies by the PWM algorithm and the resonance frequencies of the mechanical assemblies of the powered components of the HVAC and/or refrigeration system.

Figure 1A:
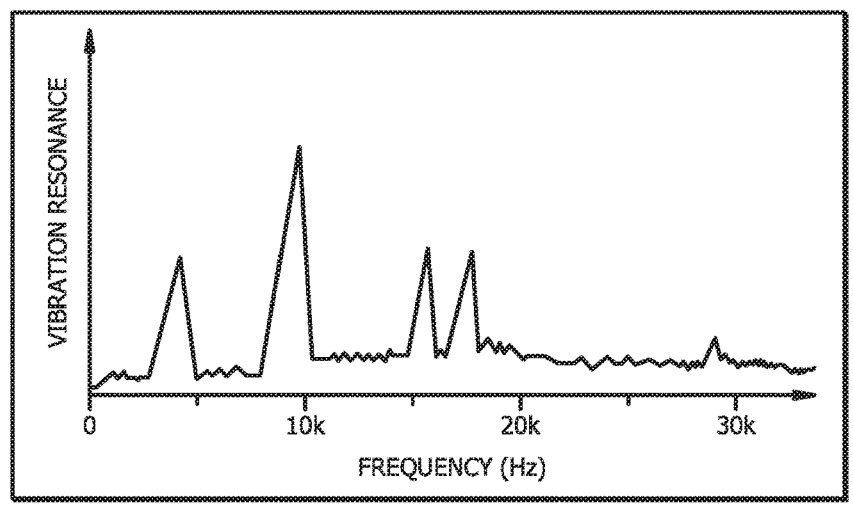
FIG. 1A illustrates an example vibration resonance plot over frequency for a mechanical assembly of a component of a HVAC and/or refrigeration system.

As an example, FIG. 1A depicts a plot of the vibration of a mechanical assembly over a frequency of injected current. For example, a mechanical assembly may have certain resonance frequencies depicted as peaks in FIG. 1A. Power delivered at those frequencies may cause more mechanical vibration than power at frequencies distant from those peaks. In this manner, what is desired is to provide a PWM algorithm that does not inject frequencies that overlap with the peaks or resonance frequencies associated with the HVAC and/or refrigeration system.

Figure 1B:
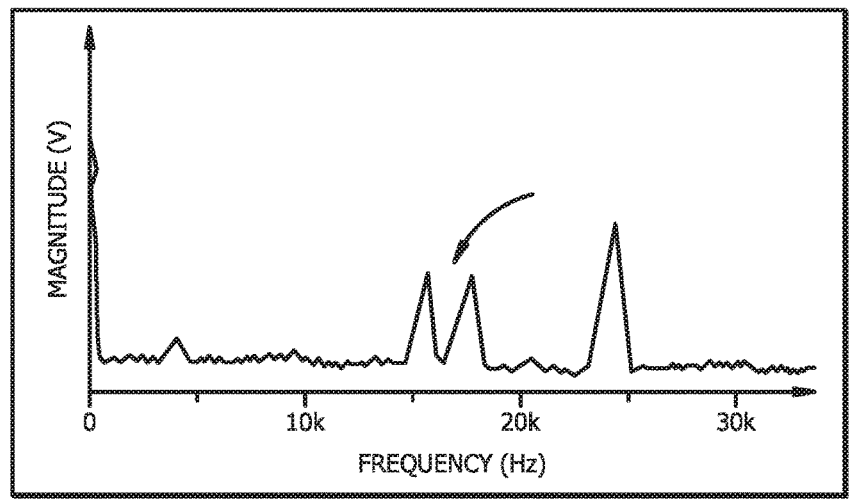
FIGS. 1B and 1C illustrate example frequency spectrum plots of the voltage supplied by a first PWM algorithm and a second PWM algorithm.
Figure 1C:
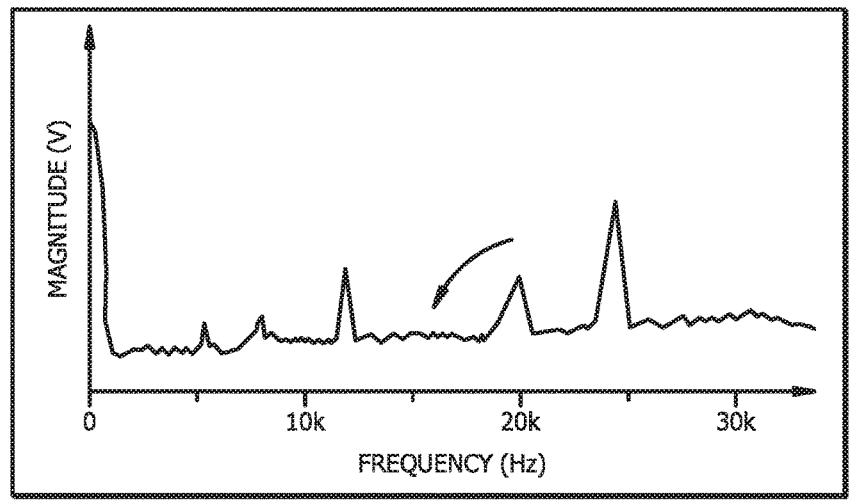

Power delivered using PWM algorithms may inject a spectrum of frequencies. Each PWM algorithm may have a different spectrum of frequencies that are injected into the power delivered to the one or more components of the HVAC and/or refrigeration system. As two examples, FIG. 1B depicts an example frequency spectrum plot of a first PWM algorithm and FIG. 1C depicts an example frequency spectrum plot of a second PWM algorithm. As shown in FIGS. 1B and 1C, different PWM algorithms may have similar or different frequency spectra. For example, the plots of the first PWM algorithm and the second PWM algorithm in FIGS. 1B and 1C demonstrate different frequency peaks at different magnitudes.

Based on the examples using FIGS. 1A-1C, a comparison between the plots in FIG. 1A and FIGS. 1B and 1C illustrate that there can be overlap between the peaks of the vibration and the magnitude found in certain PWM algorithms. For example, the frequency spectrum of the first PWM algorithm in FIG. 1B has two peaks that match the peaks of FIG. 1A. As discussed above, these resonance frequencies, if injected using the first PWM algorithm, may cause mechanical vibration that may be detrimental to the HVAC and/or refrigeration system. In comparison, the frequency spectrum of the second PWM algorithm in FIG. 1C does not show any overlapping peaks at the those frequencies. In this manner, the second PWM algorithm may mitigate better and be a better algorithm with which to operate this HVAC and/or refrigeration system since it may result less mechanical vibration in the assemblies of components of the HVAC and/or refrigeration system.

Existing systems are unable to make such determinations and adjust the PWM algorithm to reduce the mechanical vibration. Disclosed herein are certain embodiments of systems and methods that overcome this problem by providing the ability to control the PWM algorithm to reduce mechanical vibration. In certain embodiments, a controller may be interfaced with various components of the HVAC and/or refrigeration system such that the provided power or current may be sampled at a sufficient rate to analyze the frequency spectrum of the supplied power to a particular component. In some embodiments, one or more resonance frequencies of the HVAC and/or refrigeration system may be determined before installation or, in addition, during the operation of the HVAC and/or refrigeration system. In this manner, certain embodiments disclosed herein may have the ability to adjust the PWM algorithm to reduce the amount of mechanical vibration at any stage in the HVAC and/or refrigeration system's life cycle.

In certain embodiments, vibration reduction may be facilitated by sampling motor variables at a fast enough rate to calculate the causes of vibration, e.g., torque, and performing a fast Fourier transform (FFT) to obtain a frequency spectrum of the measured variables. In this manner, the fast Fourier transform spectrum may provide any modal peaks at certain frequencies to be avoided. Once determining these resonance frequencies, an optimal or most mitigating PWM algorithm may be determined. Continued monitoring of the motor variables may allow for the PWM algorithm to be adjusted at different times during operation of the HVAC and/or refrigeration system to minimize the mechanical vibrations.

Figure 2:
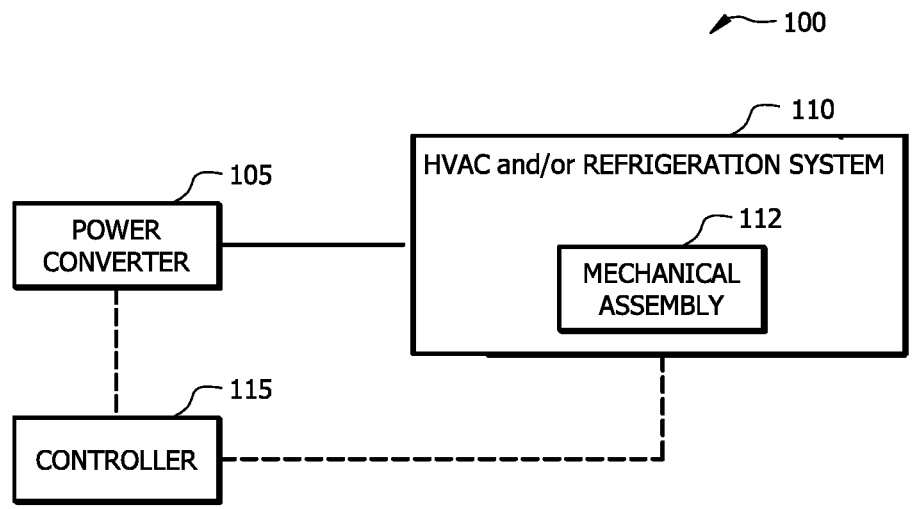
FIG. 2 illustrates an example system used for controlling the environment of a space.

FIG. 2 illustrates an example system 100 used for refrigerating, conditioning, ventilating or otherwise controlling the environment of a space. System 100 may include a power converter 105, a HVAC and/or refrigeration system 110 and a controller 115. Power converter 105, in certain embodiments, may supply power to one or more components of HVAC and/or refrigeration system 110. For example, electronic power converter 105 may be an electric power converter which sends pulses according to a pulse width modulation algorithm to one or more motor drives of HVAC and/or refrigeration system 110 in order to supply power to the one or more motor drives driving one or more components of HVAC and/or refrigeration system 110.

Controller 115 may be coupled to power converter 105 and one or more motor drives of HVAC and/or refrigeration system 110. Controller 115 may control the operation of power converter 105 and/or one or more motor drives of HVAC and/or refrigeration system 110. In certain embodiments, controller 115 may determine which PWM algorithm power converter 105 uses to supply power to one or more motor drives of HVAC and/or refrigeration system 110. In certain embodiments, controller 115 may receive information regarding the state of one or more motor drives of HVAC and/or refrigeration system 110 to determine a PWM algorithm that mitigates the mechanical vibration. Further aspects of certain embodiments of controller 115 may be described below in the description of FIG. 3.

Examples of HVAC and/or refrigeration system 110 include a system for refrigerating a space (such as a refrigerator or freezer case, e.g. in a grocery store) and a system for conditioning a space (such as an HVAC system). HVAC and/or refrigeration system 110 may be any suitable system that is used to control the environment of a space. HVAC and/or refrigeration system 110 may include a variety of components including fans, compressors, condensers, evaporators, alone or in any suitable combination thereof. Certain components of HVAC and/or refrigeration system 110 may have mechanical assemblies, such as housings and connected components to the one or more motor drives driving the components of HVAC and/or refrigeration system 110. These mechanical assemblies may vibrate during operation of the components. For example, the motor drive driving a compressor or a fan may cause their respective mechanical assembly to vibrate if the torque of the motor drive exceeds a certain value or resonates at a certain frequency. These mechanical assembly vibrations may be caused by the input power into the one or more motor drives of HVAC and/or refrigeration system 110. For example, the frequencies of the power supplied to one or more of these motor drives may cause mechanical vibrations through a resonance in the one or more motor drives of HVAC and/or refrigeration system 110. Since power converter 105 may supply power to HVAC and/or refrigeration system 110 using a PWM algorithm, the frequencies associated with the PWM algorithms may cause the mechanical vibration within one or more motor drives and components of HVAC and/or refrigeration system 110. By adjusting the PWM algorithm the mechanical vibrations may be reduced.

Figure 3:
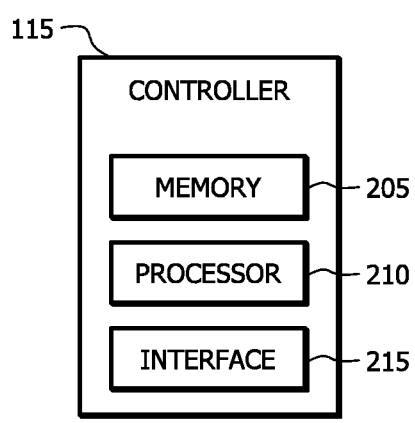
FIG. 3 illustrates an example controller used in the system of FIG. 2.

FIG. 3 depicts controller 115 of system 100. Controller 115 may include a memory 205, processing circuitry 210 and one or more interfaces 215. One or more interfaces 215 receive input (e.g., sensor data or system data), sends output (e.g., instructions), processes the input and/or output, and/or performs other suitable operation. One or more interfaces 215 may comprise hardware and/or software. As an example, one or more interfaces 215 receives information (e.g., voltage or current supplied) about one or more components, such as the motor drives, of HVAC and/or refrigeration system 110 (e.g., via sensors).

Memory (or memory unit) 205 stores information. As an example, memory 205 may store method 400. Memory 205 may comprise one or more non-transitory, tangible, computer-readable, and/or computer-executable storage media. Examples of memory 205 include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Processing circuitry 210 may include any suitable combination of hardware and software implemented in one or more modules to execute instructions and manipulate data to perform some or all of the described functions of controller 115. In some embodiments, processing circuitry 210 may include, for example, one or more computers, one or more central processing units (CPUs), one or more microprocessors, one or more applications, one or more application specific integrated circuits (ASICs), one or more field programmable gate arrays (FPGAs), and/or other logic.

As shown in FIG. 1, controller 115 may be communicatively coupled to power converter 115 and HVAC and/or refrigeration system 110. Controller 115 may be communicatively coupled to one or more motor drives or other components of HVAC and/or refrigeration system 110. In certain embodiments, controller 115 may obtain a plurality of pulse width modulation algorithms. For example, a plurality of PWM algorithms may be stored in memory 205 or may be communicated to controller 115 through one or more interfaces 215 from one or more of power converter 105 and HVAC and/or refrigeration system 110, or in some embodiments communicated over a network to controller 115 from outside of system 100. For example, an operator or an automatic process may cause controller 115 to receive additional or replacement PWM algorithms.

Each PWM algorithm may have an associated harmonic signature. For example, as depicted in FIGS. 1B and 1C, the harmonic signature may include a frequency spectrum representing the frequency components of the PWM algorithm. For example, the frequency spectrum may represent a fast Fourier transform of the PWM algorithm of a sample period. These harmonic signatures may be used to characterize each PWM algorithm. Each PWM algorithm may each have its own harmonic signature with different frequency spectra.

In certain embodiments, controller 115 may determine one or more resonance frequencies associated with the HVAC and/or refrigeration system. For example, in certain embodiments controller 115 through interface 215 may sample a torque of a motor drive driving components of HVAC and/or refrigeration system 110. Using the sampled torque data, a fast Fourier transform may be performed to determine any modal peaks of frequency in the motor drive of HVAC and/or refrigeration system 110. Other methods of determining resonance frequencies associated with HVAC and/or refrigeration system 110 may be used. For example, resonance frequencies may be determined at the time of manufacturing. In other cases, resonance frequencies may be measured by directly measuring vibrations of the mechanical assemblies of one or more motor drives or components of HVAC and/or refrigeration systems. If the vibration resulting from input power at a particular frequency exceeds a threshold or some other criteria, then that particular frequency may be a resonance frequency.

In certain embodiments, controller 115 may select a first PWM algorithm from the plurality of PWM algorithms. For example, in certain embodiments, controller 115 may first select a random PWM algorithm for power converter 105 to operate with. In certain embodiments, controller 115 may select a PWM algorithm based on the harmonic signature associated with that PWM algorithm mitigating the one or more resonance frequencies associated with the HVAC and/or refrigeration system 110. As one example, compatibility between the first PWM algorithm and the one or more resonance frequencies may be determined based on an overlap of the harmonic signature and the one or more resonance frequencies associated with the HVAC and/or refrigeration system. For example, referencing FIG. 1A and FIGS. 1B and 1C, controller 115 may select the second PWM algorithm shown in FIG. 1C because the harmonic signature has less overlap with the modal peaks shown in FIG. 1A.

Various techniques and methods may be used to determine the compatibility with the one or more resonance frequencies associated with the HVAC and/or refrigeration system. For example, the first PWM algorithm may be determined to mitigate the one or more resonance frequencies based on a probability that the first PWM algorithm would maintain mechanical vibrations below a predetermined threshold. In another example, the first PWM algorithm may mitigate the one or more resonance frequencies based on the overlap between modal peaks of the mechanical assemblies and the harmonic signature being less than a predetermined threshold. A variety of statistical analyses may be used to calculate the overlap, which may be predictive of the mechanical vibrations resulting from using a particular PWM algorithm.

As another example, the first PWM algorithm may be determined to mitigate the one or more resonance frequencies if it is within a subset of N algorithms expected to cause the lowest amount of mechanical vibrations (such as a subset comprising the best 10%, 20%, or 30% of PWM algorithms). Additional factors may be used in the selection of the mitigating PWM algorithm, such as the power efficiency of the PWM algorithm and/or the ability to meet the current demands placed on HVAC and/or refrigeration system 110.

In addition, the compatibility for a particular PWM algorithm may change over time as mechanical assemblies age or may be determined by the operational state of the HVAC and/or refrigeration system 110. For example, the one or more resonance frequencies associated with HVAC and/or refrigeration system 110 may shift or change as components of HVAC and/or refrigeration system 110 age or are replaced.

After selecting the first PWM algorithm, controller 115 may operate power converter 105 using the selected PWM algorithm. In certain embodiments, controller 115 may determine a first amount of vibration associated with operating the HVAC and/or refrigeration system according to the first PWM algorithm. For example, power converter 105 may operate using a first PWM algorithm and controller 115 may sample various values of one or more motor drives driving components of HVAC and/or refrigeration system 110 to determine a first amount of vibration associated with operating the HVAC and/or refrigeration system 110 according to that first PWM algorithm. For example, controller 115 may obtain sampled torque data from one or more motor drives or components of HVAC and/or refrigeration system 110 that may be used to determine the amount of vibration in a component of HVAC and/or refrigeration system 110. In certain embodiments, controller 115 may receive information about vibration indirectly through other components or monitoring equipment. For example, system 100 may include monitoring equipment which uses sensors or other sampling tools to determine the amount of mechanical vibration, which is then communicated to controller 115.

Controller 115, in certain embodiments, may also determine a second amount of vibration associated with operating HVAC and/or refrigeration system 110 according to a second PWM algorithm. In some embodiments, controller 115 may operate power converter 110 according to the second PWM algorithm and determine the second amount of vibration as discussed previously. In other embodiments, controller 115 may estimate the second amount of vibration using a second PWM algorithm based on the compatibility of the second PWM algorithm and the measured frequency response of one or more motor drives of HVAC and/or refrigeration system 110. For example, controller 115 may be operable to determine the overlap of any resonance frequencies and the second PWM algorithm frequency components to determine compatibility. if the second PWM algorithm will result in less vibration, controller 115 may cause power converter 105 to operate according to the second PWM algorithm.

In certain embodiments, the plurality of PWM algorithms available to controller 115 and power converter 105 may be a set of space vector sequence selection algorithms. Space vector sequence selection algorithms may be advantageous compared to other PWM implementations. For example, such algorithms may provide better fundamental output voltage, a reduction of switching frequency, and lower current ripple. In addition, space vector sequence selection algorithms may achieve similar results to other PWM algorithms, but may executed in in less time. Furthermore, such algorithms may be simpler than other algorithms and have an easier direct hardware implementation using a digital signal processor. Persons having skill in the art will recognize the other various advantages of using space vector sequence selection algorithms. In certain embodiments, the plurality of PWM algorithms may include algorithms that are not in the set of space vector sequence selection algorithms. For example, the plurality of PWM algorithms available to controller 115 may include a mixed set of PWM algorithms including Space vector sequence selection algorithms and delta, delta-sigma, direct torque control, and/or time-proportioning algorithms.

In certain embodiments, HVAC and/or refrigeration system 110 includes one or more motor drives driving components that include a mechanical assembly. A mechanical assembly may be a mechanical assembly of a fan, compressor, a condenser, an evaporator, or other component used to environmentally control a space. Mechanical assemblies of the components of HVAC and/or refrigeration system 110 may vibrate due to the input power, such as the resulting current generated by the potential supplied to the one or more motors by power converter 105. For example, the mechanical assembly of a compressor may vibrate based on the torque of the driving motor of the compressor which may move with certain frequencies based on the input frequencies of the line voltage from power converter 105.

Controller 115 may, in certain embodiments, measure one or more resonance frequencies of HVAC and/or refrigeration system 110 and select a PWM algorithm for power converter 105 during operation of system 100. For example, controller 115 may determine certain resonance frequencies during operation of system 100 and adjust PWM algorithm based on the operational status and/or current mode of operation of system 100. In this manner, PWM algorithms may be adjusted according to current conditions of HVAC and/or refrigeration system and not just conditions when first installed or using predetermined values.

In certain embodiments, controller 115 may compare one or more resonance frequencies associated with HVAC and/or refrigeration system 110 to the associated harmonic signature of each of the plurality of PWM algorithms available to controller 115. For example, controller 115 may sample or receive one or more resonance frequencies of HVAC and/or refrigeration system 110. Using those resonance frequencies, controller 115 may search through all the available PWM algorithms to determine a best, i.e., a most mitigating, PWM algorithm. For example, controller 115 may select a PWM algorithm that is most mitigating with the one or more resonance frequencies of HVAC and/or refrigeration system 110 that minimizes the mechanical vibration. Controller 115 may then cause power converter 105 to operate using the most mitigating PWM algorithm.

As discussed before in certain embodiments, the one or more resonance frequencies of HVAC and/or refrigeration system 110 may be based on sampled current values in the one or more motor drives driving components of HVAC and/or refrigeration system 110. For example, the sampled current values may represent the torque in the associated motor drives. This torque may translate into mechanical vibration. Limiting this torque may reduce the amount of mechanical vibrations in one or more components of HVAC and/or refrigeration system 110. In addition, the torque may have certain modal peaks which represents a higher response to particular frequencies. In this manner, one or more resonance frequencies may be determined using one or more modal peaks determine using the current and/or torque associated with the current.

In certain embodiments, the one or more resonance frequencies associated with HVAC and/or refrigeration system 110 may be predetermined values. For example, certain components may have predetermined values of resonance that may be communicated to controller 115 during installation of the various components. For example, well known components may have well established responses to various currents and torque responses to certain frequencies of current supplied to power the various components. However, in certain embodiments, one or more resonance frequencies may not be predetermined values. For example, mechanical assemblies of components may have different vibrational responses throughout their lifetime. As certain components become looser or rusted the frequency vibration response may change over time. In this manner, the one or more resonance frequencies associated with HVAC and/or refrigeration system 110 may change over time and may not be predetermined values. However, in certain cases during and shortly after the first installation, predetermined values may be useful in determining the PWM algorithm to best serve the various components of HVAC and/or refrigeration system 110.

Figure 4:
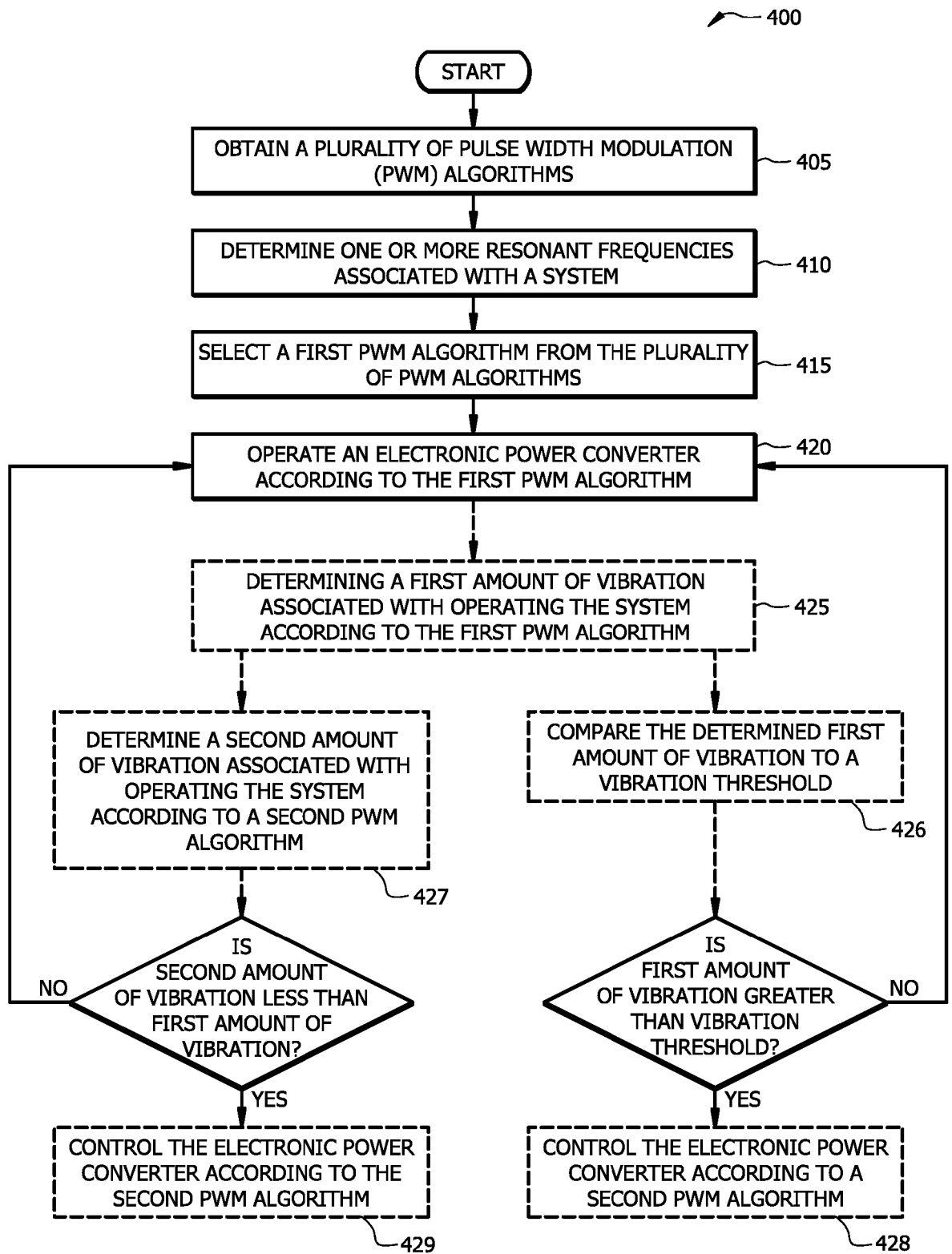
FIG. 4 is a flowchart illustrating a method of operating the example system of FIG. 2.

FIG. 4 is a flowchart illustrating a method 400 of operating system 100 of FIG. 2. In particular embodiments, various components of system 100 perform the steps and method 400.

Method 400 may begin at step 405. At step 405, controller 115 obtains a plurality of pulse width modulation algorithms. For example, controller 115 may obtain a plurality of PWM algorithms from memory 205 or may receive through one or more interfaces 215 from other components of system 100 or through a network connected to other systems which communicate a plurality or one or more PWM algorithms to controller 115.

After obtaining a plurality of PWM algorithms, in step 410, one or more resonance frequencies of the HVAC and/or refrigeration system 110 may be determined. For example, controller 115 may receive information regarding HVAC and/or refrigeration system 110 with which one or more resonance frequencies may be deduced. For example, using sampled current and/or torque calculations, certain resonance frequencies may be determined. For example, the calculated torque response to a current PWM switching algorithm may present certain modal frequencies which represent the resonance frequencies of certain mechanical assemblies that may vibrate.

At step 415, a first PWM algorithm from the plurality of PWM algorithms is selected. The first PWM algorithm may be selected based on at least on the resonance frequencies associated with HVAC and/or refrigeration system 110 determined in step 410. For example, a first PWM algorithm may be selected because it is the most mitigating of the one or more resonance frequencies. In certain embodiments, the selected PWM algorithm may be the PWM algorithm of the plurality of algorithms that has the smallest amount of frequency components of harmonics overlapping with of the one or more resonance frequencies associated with HVAC and/or refrigeration system 110.

At step 420, an electronic power converter may be operated according to the first PWM algorithm selected in step 415. In this manner, power converter 105 may provide current based on the switching on and off according to the first PWM algorithm. By operating the power converter 105 using the selected PWM algorithm, the mechanical vibrations in one or more components of HVAC and/or refrigeration system 110 may be reduced.

In certain embodiments, method 400 may comprise additional steps. For example, FIG. 4 depicts optional steps depicted in dash boxes. For example, method 400 may include an optional step 425. At step 425, a first amount of vibration associated with operating the HVAC and/or refrigeration system 110 according to the first PWM algorithm is determined. For example, during operation of system 100 the amount of vibration in mechanical assemblies of certain components of HVAC and/or refrigeration system 110 may be determined. In certain embodiments, controller 115 may determine such amount of vibration. In other embodiments, other components of system 100 or coupled to system 100 may determine the amount of vibration. For example, a monitoring system or other sensing or calculating systems may be used to determine the amount of vibration. As one example, controller 115 may obtain sampled information regarding the torque in certain motor drives driving components of HVAC and/or refrigeration system 110 and determine the amount of vibration.

In the depicted example of the flowchart on FIG. 4, method 400 may continue along one of two optional paths after step 425. System 100 may operate according to method 400 according to either or both of these optional paths at different times during operation of HVAC and/or refrigeration system 110. In the right path, method 400 may optionally proceed to step 426 during which the first amount of vibration is compared to a vibration threshold. For example, a vibrational set point may be provided such that the determined first amount of vibration may be compared to the vibrational set point. For example, if the vibration exceeds a certain amount either in the amount of vibration, the amount of sound generated or other criteria indicating a certain level of vibration, those values may be compared to a set point or another value determined by system 100. If the first amount of vibration is greater than a vibration threshold, method 400 may move to optional step 428. If the first amount is not greater than the vibration threshold, e.g., the amount of vibration is below the vibrational set point, method 400 may proceed back to step 420 and continue to operate power converter 105 according to the first algorithm.

At optional step 428, the electronic power converter may be controlled according to a second PWM algorithm. For example, controller 115 after determining that the first amount of vibration is greater than the vibrational threshold may select a second PWM algorithm to replace the first PWM algorithm. In this manner, controller 115 may control power converter 105 using the second PWM algorithm. In certain embodiments, controller 115 may choose a second PWM algorithm such that the vibration is reduced in one or more components of HVAC and/or refrigeration system 110. It may do this by comparing the harmonic signature of the available PWM algorithms and compare that with the determined resonance frequencies of certain frequencies of HVAC and/or refrigeration system 110. In certain embodiments, controller 115 or other components may update the PWM algorithm and data used to determine the PWM algorithm on an ongoing basis such that PWM algorithms may be updated during operation and the life cycle of system 100. In other embodiments, the second PWM algorithm may be chosen randomly.

In the left path, method 400 may move from optional step 425 to optional step 427. At step 427, a second amount of vibration associated with operating the HVAC and/or refrigeration system according to a second PWM algorithm is determined. For example, controller 115 may compare the harmonic signature of a second PWM algorithm to the one or more resonance frequencies of HVAC and/or refrigeration system 110. For example, in certain embodiments, controller 115 may scan all available PWM algorithms and compare it to the one or more resonance frequencies of HVAC and/or refrigeration system 110. In this manner, controller 115 may select the best, or the most mitigating, second PWM algorithm to minimize the mechanical vibration of the mechanical assemblies of one or more components of HVAC and/or refrigeration system 110.

If the second amount of vibration is less than the first amount of vibration, method 400 may move to optional step 429. If the second amount of vibration is not less than the first amount of vibration, method 400 may move to step 420 and continue to operate power converter 105 according to the first PWM algorithm since the second PWM algorithm would not reduce the amount of vibration in HVAC and/or refrigeration system 110.

In the case where the second amount of vibration is less than the first amount of vibration, method 400 may move to step 429 wherein power converter 105 may be controlled by controller 115 according to the second PWM algorithm. For example, in this manner a second PWM algorithm which reduces the amount of vibration may be used for the switching algorithm for power converter 105. In this manner, the amount of vibration in HVAC and/or refrigeration system 110 may be reduced.

The various control loops may be continuously run throughout the lifetime and the operation of system 100. In certain embodiments, the control loops may be run only in select circumstances, e.g., when vibration exceeds a threshold. Different criteria may be used in different circumstances. For example, during different operational states of system 100, different control loops may be used. For instance, the right path of FIG. 4 may be used when in an idle mode and the left path may be used when in an active mode.

Modifications, additions, or omissions may be made to method 400 depicted in FIG. 4. Method 400 may include more, fewer, or other steps. For example, steps may be performed in parallel or in any suitable order. While discussed as various components of system 100 performing the steps, any suitable component or combination of components of system 100 may perform one or more steps of the method.

Although the present disclosure includes several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method, comprising:
obtaining a plurality of pulse width modulation (PWM) algorithms, each PWM algorithm of said plurality of PWM algorithms having an associated harmonic signature;
determining at least one or more resonance frequencies associated with either or both of an HVAC system and a refrigeration system;
selecting a first PWM algorithm from the plurality of PWM algorithms based at least in part on the harmonic signature associated with the first PWM algorithm mitigating the at least one or more resonance frequencies associated with either or both of the HVAC system and the refrigeration system; and
operating an electronic power converter operable to supply power to at least one or more motor drives of either or both of the HVAC system and the refrigeration system according to the first PWM algorithm.

2. The method of claim 1, further comprising:
determining a first amount of vibration associated with operating either or both of the HVAC system and the refrigeration system according to the first PWM algorithm;
determining a second amount of vibration associated with operating either or both of the HVAC system and the refrigeration system according to a second PWM algorithm of the plurality of PWM algorithms; and
controlling the electronic power converter according to the second PWM algorithm in response to a determination that the second amount of vibration is less than the first amount of vibration.

3. The method of claim 1, further comprising:
determining a first amount of vibration associated with operating either or both of the HVAC system and the refrigeration system according to the first PWM algorithm;
comparing the determined first amount of vibration to a vibration threshold; and
based on the comparison, controlling the electronic power converter according to a second PWM algorithm of the plurality of PWM algorithms.

4. The method of claim 1, wherein the at least one or more motors drives drive at least one or more of a fan, a condenser, and a compressor, each comprising a mechanical assembly.

5. The method of claim 1, further comprising measuring the at least one or more resonance frequencies associated with the HVAC and/or refrigeration system and selecting the first PWM algorithm during operation of the HVAC and/or refrigeration system.

6. The method claim 1, wherein selecting a first PWM algorithm comprises:
comparing the at least one or more resonance frequencies associated with either or both of the HVAC system and the refrigeration system to the associated harmonic signature of each of the plurality of PWM algorithms; and based on the comparisons, selecting the PWM algorithm that most mitigates the at least one or more resonance frequencies associated with the HVAC and/or refrigeration system as the first PWM algorithm.

7. The method of claim 1, wherein determining the at least one or more resonance frequencies associated with a refrigeration system comprises:
obtaining current values in the at least one or more motor drives of the HVAC and/or refrigeration system;
based on the obtained current values, calculating torque in the at least one or more motors drives of the HVAC and/or refrigeration system; and
detecting at least one or more modal peaks in the calculated torque.

8. The method of claim 1, wherein the at least one or more resonance frequencies associated with the HVAC and/or refrigeration system are predetermined values associated with the at least one or more components of the HVAC and/or refrigeration system.

9. A method, comprising:
obtaining a plurality of pulse width modulation (PWM) algorithms, each PWM algorithm of said plurality of PWM algorithms having an associated harmonic signature;
determining at least one or more resonance frequencies associated with either or both of an HVAC system and a refrigeration system;
selecting a first PWM algorithm from the plurality of PWM algorithms based at least in part on the harmonic signature associated with the first PWM algorithm mitigating the at least one or more resonance frequencies associated either or both of the HVAC system and the refrigeration system; and
operating an electronic power converter operable to supply power to at least one or more motor drives of either or both of the HVAC system and the refrigeration system according to the first PWM algorithm;
wherein selecting a first PWM algorithm comprises:
comparing the at least one or more resonance frequencies associated with either or both of the HVAC system and the refrigeration system to the associated harmonic signature of each of the plurality of PWM algorithms;
based on the comparisons, selecting the PWM algorithm that most mitigates the at least one or more resonance frequencies associated with either or both of the HVAC system and the refrigeration system as the first PWM algorithm; and
the at least one or more resonance frequencies associated with either or both of the HVAC system and the refrigeration system are predetermined values associated with at least one or more components of either or both of the HVAC system and the refrigeration system.

10. The method of claim 9, further comprising:
determining a first amount of vibration associated with operating either or both of the HVAC system and the refrigeration system according to the first PWM algorithm;
determining a second amount of vibration associated with operating either or both of the HVAC system and the refrigeration system according to a second PWM algorithm of the plurality of PWM algorithms; and
controlling the electronic power converter according to the second PWM algorithm in response to a determination that the second amount of vibration is less than the first amount of vibration.

11. The method of claim 9, further comprising:
determining a first amount of vibration associated with operating either or both of the HVAC system and the refrigeration system according to the first PWM algorithm;
comparing the determined first amount of vibration to a vibration threshold; and
based on the comparison, controlling the electronic power converter according to a second PWM algorithm of the plurality of PWM algorithms.

12. The method of claim 9, wherein the at least one or more motors drives drive at least one or more of a fan, a condenser, and a compressor, each comprising a mechanical assembly.

13. The method of claim 9, further comprising measuring the at least one or more resonance frequencies associated with either or both of the HVAC system and the refrigeration system and selecting the first PWM algorithm during operation of either or both of the HVAC system and the refrigeration system.

14. The method of claim 9, wherein determining the at least one or more resonance frequencies associated with a refrigeration system comprises:
obtaining current values in the at least one or more motor drives of either or both of the HVAC system and the refrigeration system;
based on the obtained current values, calculating torque in the at least one or more motors drives of either or both of the HVAC system and the refrigeration system; and
detecting at least one or more modal peaks in the calculated torque.

15. A method, comprising:
obtaining a plurality of pulse width modulation (PWM) algorithms, each PWM algorithm of said plurality of PWM algorithms having an associated harmonic signature;
determining at least one or more resonance frequencies associated with either or both of the HVAC system and a refrigeration system;
selecting a first PWM algorithm from the plurality of PWM algorithms based at least in part on the harmonic signature associated with the first PWM algorithm mitigating the at least one or more resonance frequencies associated with either or both of the HVAC system and the refrigeration system; and
operating an electronic power converter operable to supply power to at least one or more motor drives of either or both of the HVAC system and the refrigeration system according to the first PWM algorithm;
wherein determining the at least one or more resonance frequencies associated with a refrigeration system comprises:
obtaining current values in the at least one or more motor drives of either or both of the HVAC system and the refrigeration system;
based on the obtained current values, calculating torque in the at least one or more motors drives of either or both of the HVAC system and the refrigeration system;
detecting at least one or more modal peaks in the calculated torque; and
the at least one or more resonance frequencies associated with either or both of the HVAC system and the refrigeration system are predetermined values associated with at least one or more components of the HVAC and/or refrigeration system.

16. The method of claim 15, further comprising:
determining a first amount of vibration associated with operating either or both of the HVAC system and the refrigeration system according to the first PWM algorithm;
determining a second amount of vibration associated with operating either or both of the HVAC system and the refrigeration system according to a second PWM algorithm of the plurality of PWM algorithms; and
controlling the electronic power converter according to the second PWM algorithm in response to a determination that the second amount of vibration is less than the first amount of vibration.

17. The method of claim 15, further comprising:
determining a first amount of vibration associated with operating the HVAC and/or refrigeration system according to the first PWM algorithm;
comparing the determined first amount of vibration to a vibration threshold; and
based on the comparison, controlling the electronic power converter according to a second PWM algorithm of the plurality of PWM algorithms.

18. The method of claim 15, wherein the at least one or more motors drives drive at least one or more of a fan, a condenser, and a compressor, each comprising a mechanical assembly.

19. The method of claim 15, further comprising measuring the at least one or more resonance frequencies associated with either or both of the HVAC system and the refrigeration system and selecting the first PWM algorithm during operation of the HVAC or refrigeration system.

20. The method claim 15, wherein selecting a first PWM algorithm comprises:
comparing the at least one or more resonance frequencies associated with the HVAC and/or refrigeration system to the associated harmonic signature of each of the plurality of PWM algorithms; and
based on the comparisons, selecting the PWM algorithm that most mitigates the at least one or more resonance frequencies associated with the HVAC and/or refrigeration system as the first PWM algorithm.

* * * * *